(12) United States Patent
Kaptanoglu

(10) Patent No.: US 7,557,612 B2
(45) Date of Patent: *Jul. 7, 2009

(54) BLOCK SYMMETRIZATION IN A FIELD PROGRAMMABLE GATE ARRAY

(75) Inventor: Sinan Kaptanoglu, Belmont, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/130,876

(22) Filed: May 30, 2008

(65) Prior Publication Data

US 2008/0258763 A1 Oct. 23, 2008

Related U.S. Application Data

(63) Continuation of application No. 11/748,865, filed on May 15, 2007, now Pat. No. 7,385,421, which is a continuation of application No. 11/056,984, filed on Feb. 11, 2005, now Pat. No. 7,233,167, which is a continuation of application No. 10/670,883, filed on Sep. 24, 2003, now Pat. No. 6,861,869, which is a continuation of application No. 09/880,629, filed on Jun. 12, 2001, now Pat. No. 6,680,624, which is a continuation of application No. 09/518,974, filed on Mar. 6, 2000, now Pat. No. 6,268,743.

(51) Int. Cl.
*H03K 19/177* (2006.01)
(52) U.S. Cl. .......................................... 326/41; 326/38
(58) Field of Classification Search ............. 326/37–41, 326/46
See application file for complete search history.

(56) References Cited

U.S. PATENT DOCUMENTS

| 5,311,080 | A | | 5/1994 | Britton et al. |
|---|---|---|---|---|
| 5,469,003 | A | | 11/1995 | Kean |
| 5,490,074 | A | | 2/1996 | Agrawal et al. |
| 5,509,128 | A | | 4/1996 | Chan |
| 5,537,057 | A | | 7/1996 | Leong et al. |
| 5,598,109 | A | | 1/1997 | Leong et al. |
| 5,644,496 | A | * | 7/1997 | Agrawal et al. ............... 716/17 |

(Continued)

OTHER PUBLICATIONS

U.S. Appl. No. 09/519,082, filed Mar. 6, 2000 and abandoned.

(Continued)

*Primary Examiner*—Don P Le
(74) *Attorney, Agent, or Firm*—Lewis and Roca LLP

(57) ABSTRACT

An FPGA architecture has top, middle and low levels. The top level is an array of B16×16 tiles enclosed by I/O blocks. The routing resources in the middle level are expressway routing channels including interconnect conductors. At the lowest level, there are block connect routing channels, local mesh routing channels, and direct connect interconnect conductors to connect the logic elements to further routing resources. Each B1 block includes four clusters of devices. Each of the clusters includes first and second LUT3s, a LUT2, and a DFF. Each of the LUT3s have three inputs and one output. Each of the LUT2s have two inputs and one output. Each DFF has a data input and a data output. In each of the clusters the outputs of the LUT3s are multiplexed to the input of DFF, and symmetrized with the output of the DFF to form two outputs of each of the clusters.

12 Claims, 6 Drawing Sheets

U.S. PATENT DOCUMENTS

| | | |
|---|---|---|
| 5,648,913 A | 7/1997 | Bennett et al. |
| 5,671,432 A | 9/1997 | Bertolet et al. |
| 5,682,107 A | 10/1997 | Tavana et al. |
| 5,815,004 A | 9/1998 | Trimberger et al. |
| 5,850,564 A | 12/1998 | Ting et al. |
| 5,966,027 A | 10/1999 | Kapusta et al. |
| 6,038,627 A | 3/2000 | Plants |
| 6,107,822 A | 8/2000 | Mendel et al. |
| 6,130,551 A | 10/2000 | Agrawal et al. |
| 6,150,841 A | 11/2000 | Agrawal et al. |
| 6,205,533 B1 | 3/2001 | Margolus |
| 6,268,743 B1 | 7/2001 | Kaptanoglu |
| 6,285,212 B1 | 9/2001 | Kaptanoglu |
| 6,286,093 B1 | 9/2001 | Chang et al. |
| 6,289,494 B1 | 9/2001 | Sample et al. |
| 6,300,793 B1 | 10/2001 | Ting et al. |
| 6,338,106 B1 | 1/2002 | Vorbach et al. |
| 6,567,968 B1 | 5/2003 | Kaptanoglu |
| 6,636,930 B1 | 10/2003 | Kaptanoglu |
| 6,680,624 B2 | 1/2004 | Kaptanoglu |
| 6,861,869 B1 | 3/2005 | Kaptanoglu |
| 7,233,167 B1 | 6/2007 | Kaptanoglu |
| 7,385,421 B2 | 6/2008 | Kaptanoglu |
| 2003/0196184 A1 | 10/2003 | Kaptanoglu |
| 2006/0114023 A1 | 6/2006 | Ting et al. |
| 2007/0210829 A1 | 9/2007 | Kaptanoglu |

OTHER PUBLICATIONS

Lai, Yen-Tai, "Hierarchical Interconnect Structures for Field Programmable Gate Arrays," IEEE Transactions on Very Large Scale Integration (VLSI) Systems, vol. 5, Issue 2, pp. 185-196, Jun. 1997.

* cited by examiner

BLOCK SYMMETRIZATION IN A FIELD PROGRAMMABLE GATE ARRAY

CROSS-REFERENCE TO RELATED APPLICATIONS

This application is a continuation of U.S. patent application Ser. No. 11/748,865, filed May 15, 2007, now issued as U.S. Pat No. 7,385,421, which is a continuation of U.S. patent application Ser. No. 11/056,984, filed Feb. 11, 2005, now issued as U.S. Pat. No. 7,233,167, which is a continuation of U.S. patent application Ser. No. 10/670,883, filed Sep. 24, 2003, now issued as U.S. Pat. No. 6,861,869, which is a continuation of U.S. patent application Ser. No. 09/880,629, filed Jun. 12, 2001, now issued as U.S. Pat. No. 6,680,624, which is a continuation of U.S. patent application Ser. No. 09/518,974, filed Mar. 6, 2000, now issued as U.S. Pat. No. 6,268,743, which are hereby incorporated by reference as if set forth herein.

BACKGROUND OF THE INVENTION

1. Field of the Invention

The present invention relates to a field programmable gate array (FPGA) architecture.

More particularly, the present invention relates to structures for coupling routing resources to one another in an FPGA architecture.

2. The Background Art

In the FPGA art, both antifuse based programmable architectures and SRAM based reprogrammable architectures are well known. In an FPGA, the logic elements in the gate array are connected together by routing resources to form a desired integrated circuit. The routing resources are connected to each other and to the logic elements in the gate array by programmable elements. In a antifuse based device, the number of the programmable elements far exceeds the number of elements in an SRAM based device because the area required for an antifuse is much smaller than an SRAM bit. Despite this space disadvantage of an SRAM based device, SRAM based devices are implemented because they are reprogrammable, whereas an antifuse device is presently one-time programmable.

Due to the area required for an SRAM bit, a reprogrammable SRAM bit cannot be provided to connect routing resources to each other and the logic elements at every desired location. The selection of only a limited number of locations for connecting the routing resources with one another and the logic elements is termed "depopulation". Because the capability to place and route a wide variety of circuits in an FPGA depends upon the availability of routing and logic resources, the selection of the locations at which the programmable elements should be made with great care.

Some of the difficulties faced in the place and route caused by depopulation may be alleviated by creating symmetries in the FPGA. For example, look-up tables (LUT) are often employed at the logic level in an SRAM based FPGA, because a LUT has perfect symmetry among its inputs. The need for greater symmetry in a reprogrammable FPGA architecture does not end with the use of look-up tables. It also extends to the manner in which routing resources are connected together, the manner in which routing resources are connected to the logic elements, and further symmetrization internal to the logic block. Without a high degree of symmetry in the architecture, the SRAM memory bit depopulation makes the place and route of nets in an SRAM based FPGA difficult.

It is therefore an object of the present invention to improve the symmetry in the logic block of the FPGA architecture to improve the routability of nets within the logic block and nets that are driven from inside the logic block that drive inputs both inside and outside the logic block.

BRIEF DESCRIPTION OF THE INVENTION

The present invention is directed to aspects of a semi-hierarchical architecture in an FPGA having top, middle and low levels. The FPGA architecture has structures for connecting the routing resources in the FPGA to one another and to the logic resources to improve the symmetry of the FPGA architecture and thereby increase the place and routability of an FPGA.

The top level of the architecture is an array of the B16×16 tiles arranged in a rectangular array and enclosed by I/O blocks on the periphery. On each of the four sides of a B16×16 tile, and also associated with each of the I/O blocks is a freeway routing channel. The width freeway routing channel in the rectangular array can be changed to accommodate different numbers of B16×16 tiles without disturbing the internal structure of the B16×16 tiles. The freeway routing channels can be extended in any combination of directions at each end by a freeway turn matrix (F-turn).

A B16×16 tile in the middle level of hierarchy is a sixteen by sixteen array of B1 blocks. The B16×16 tile is a nesting of a B2×2 tile that includes a two by two array of four B1 blocks. The B2×2 tiles are stepped into a four by four array of sixteen B1 blocks in a B4×4 tile, and the B4×4 tiles are stepped into an eight by eight array of sixty-four B1 blocks in a B8×8 tile. A B16×16 tile includes four B8×8 tiles.

The routing resources in the middle level of hierarchy are expressway routing channels M1, M2, and M3 including groups of interconnect conductors. The expressway routing channels M1, M2, and M3 are segmented, and between each of the segments in the expressway routing channels M1, M2, and M3 are disposed extensions that can extend the expressway routing channel M1, M2, or M3 an identical distance along the same direction. The segments of an M3 expressway routing channel is extended at the boundary of a B16×16 tile where an expressway routing channel M3 crosses a freeway routing channel by an F-tab, and otherwise by an M3 extension.

At the lowest level of the semi-hierarchical FPGA architecture, there are block connect (BC) routing channels, local mesh (LM) routing channels, and direct connect (DC) interconnect conductors to connect the logic elements to further routing resources.

A B1 block is at the lowest level in the FPGA architecture. Each B1 block includes four clusters of devices. Each of the four clusters includes first and second LUT3s, a UJT2, and a DFF. Each of the LUT3s have first, second, and third inputs and a single output. Each of the LUT2s have first and second inputs and a single output. With a LUT3 any three input Boolean logic function may be implemented, and with a LUT2 any two input Boolean logic function may be implemented. Each DFF has a data input and a data output. In each of the clusters the outputs of the LUT3s are multiplexed to the input of DFF, and symmetrized with the output of the DFF to form first and second outputs of each of the clusters.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

The present invention is directed to aspects of a semi-hierarchical architecture implemented in an FPGA having top, middle and low levels. In a semi-hierarchical architecture according to the present invention, the three levels of the architecture may be coupled to one another as in a hierarchy or the routing resources in each of the three levels may be extended to similar architectural groups in the same level of the architecture. The semi-hierarchical nature of the FPGA architecture according to the present invention significantly improves the place and route of nets or circuits in the lowest level of the architecture and in the connection of these nets to higher levels in the semi-hierarchical architecture. To better understand the present invention, a description of the three levels of the semi-hierarchical architecture is made herein.

Figure 1:
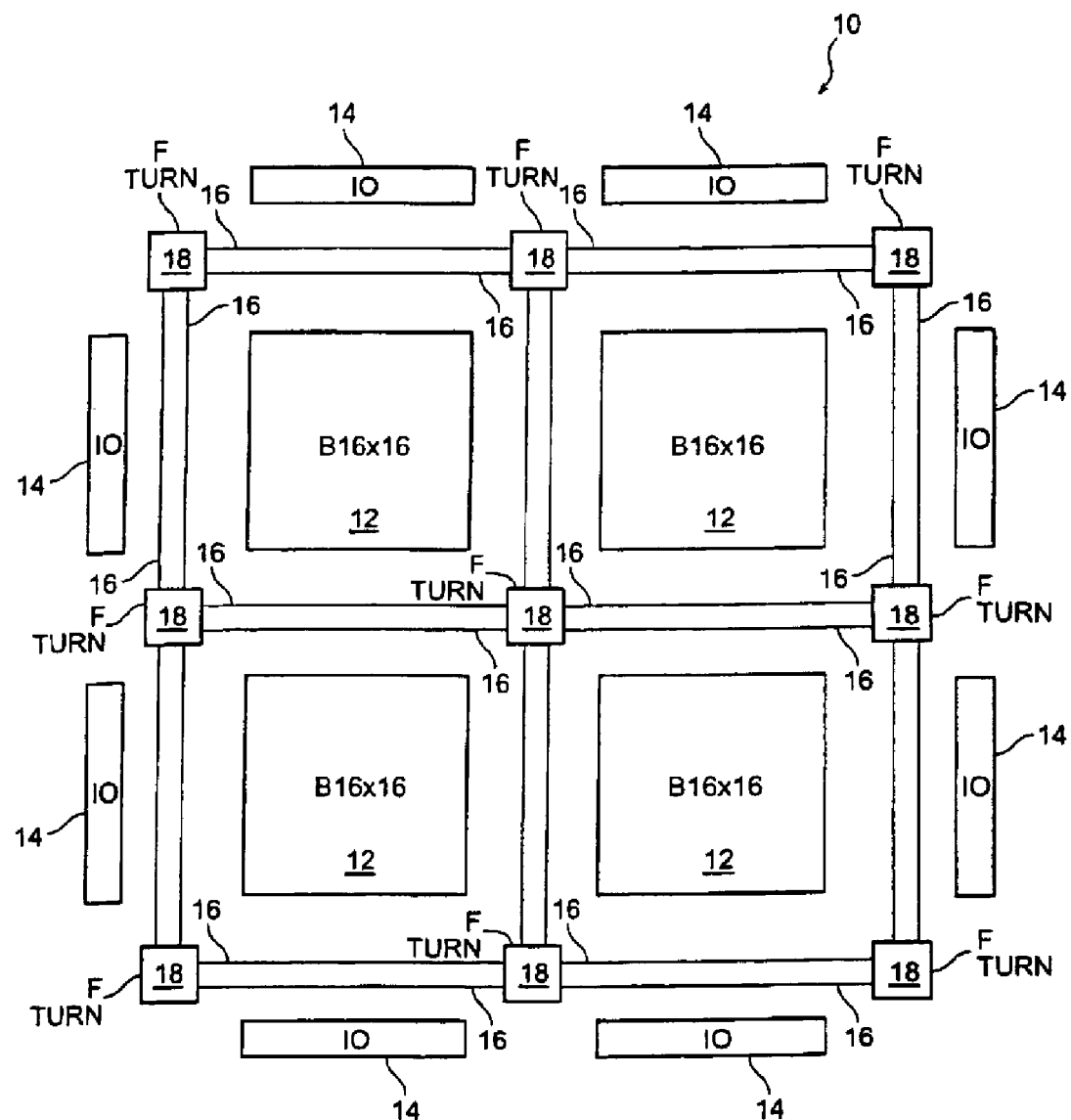
FIG. 1 is a block diagram of the floor plan of an FPGA including the top level of a semi-hierarchical architecture according to the present invention.

Turning now to FIG. 1 a block diagram of the floor plan of an FPGA 10 according to the present invention including the top level of the semi-hierarchical architecture is illustrated. The top level of the architecture is an array of the B 16×16 tiles 12 arranged in a rectangular array and enclosed by I/O blocks 14 on the periphery and the associated routing resources. A B16×16 tile 12 is a sixteen by sixteen array of B1 blocks. As will be described in detail below, a B16×16 tile 12 and its associated routing resources represents the middle level in the semi-hierarchical architecture, and a B1 block and its associated routing resources represents the lowest level in the semi-hierarchical architecture.

On each of the four sides of a B16×16 tile 12, and also associated with each of the I/O blocks 14 is freeway routing channel 16. The coupling of a freeway routing channel 16 to the routing resources in the middle level of the semi-hierarchical architecture will be described in greater detail below. From FIG. 1, it should be appreciated that on each side of a B 16×16 tile 12 there are two freeway routing channels 16, either as a result of the disposition of two freeway routing channels 16 between adjacent B16×16 tiles 12 or as a result of the disposition of two freeway routing channels between a B16×16 tile 12 and an adjacent I/O block 14.

It should be appreciated that the number of B16×16 tiles 12 in the rectangular array may be fewer or greater than the four shown in FIG. 1. According to the present invention, it is presently contemplated that the width of a freeway routing channel 16 in the rectangular array can be changed to accommodate different numbers of B16×16 tiles 12 without disturbing the internal structure of the B16×16 tiles 12. In this manner, the floorplan of the FPGA 10 can readily be custom sized by including the desired number of B16×16 tiles 12 in the design.

The freeway routing channels 16 can be extended in any combination of directions at each end by a freeway mm matrix (F-turn) 18. An F-turn 18 is an active device that includes tri-state buffers and a matrix of reprogrammable switches. The reprogrammable switches are preferably pass devices controlled by a SRAM bit. The interconnect conductors in the freeway routing channels 16 that are fed into an F-turn 18 may be coupled to many of the other interconnect conductors in the freeway routing channels 16 that come into the F-turn 18 by the reprogrammable switches.

To avoid overcomplicating the disclosure and thereby obscuring the present invention an F-turn 18 is not described in detail herein. An implementation of an F-turn 18 suitable for use according to the present is disclosed in U.S. patent application Ser. No. 09/519,082, filed Mar. 6, 2000, now abandoned, and hereby incorporated by reference.

The freeway routing channels 16 along with the F-turns 18 form a course mesh. A freeway routing channel 16 will very rarely be utilized all by itself without any extension, since such distances are abundantly covered by the routing resources in the middle hierarchy to be described below. A freeway routing channel 16 is primarily intended to be used in conjunction with one or more other freeway routing channel 16 in any direction that together can span a distances of two or more B16×16 tiles 12.

Figure 2:
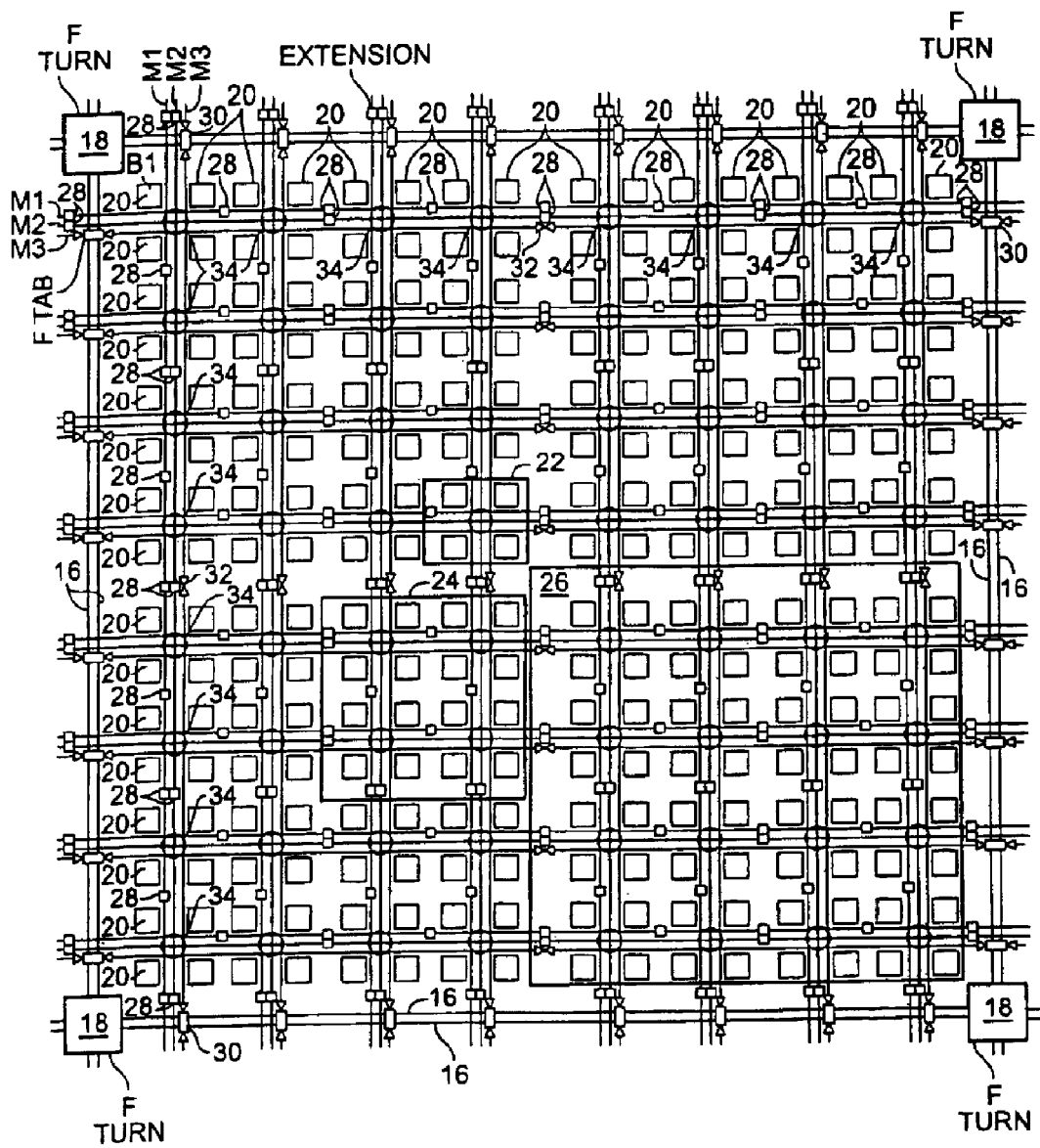
FIG. 2 is a block diagram of a B16×16 tile in an FPGA and the associated routing resources in the middle level of a semi-hierarchical architecture according to the present invention.

In FIG. 2, a block diagram of a B16×16 tile 12 and the associated routing resources in the middle level of hierarchy is illustrated. The B16×16 tile 12 is a sixteen by sixteen array of B1 blocks 20. To avoid overcomplicating the drawing figure, only the B1 blocks 20 in a single row and a single column are indicated by the reference numeral 20. The B16× 16 tile 12 is based on the repetition and nesting of smaller groupings (tiles) of B1 blocks 20. The smallest tile that is directly replicated and stepped is a B2×2 tile 22, which includes a two by two array of four B1 blocks 20. The B2×2 tiles 22 are stepped into a four by four array of sixteen B1 blocks 20 in a B4×4 tile 24, and the B4×4 tiles 24 are stepped into a eight by eight 8 array of sixty-four B1 blocks 20 in a B8×8 tile 26. A B16×16 tile 12 includes four B8×8 tiles 26.

Though not depicted in FIG. 2, the B16×16 tile 12 further includes a block of user assignable static random access memory (SRAM) disposed between the two upper B8×8 tiles 26, and a block of user assignable SRAM disposed between the two lower B8×8 tiles 26.

The routing resources in the middle level of hierarchy are termed expressway routing channels. There are three types of expressway routing channels, namely M1, M2, and M3. In FIG. 2, only a single row and a single column of expressway routing channels M1, M2, and M3 are denominated to avoid overcomplicating the drawing figure. In a preferred embodiment of the present invention, there is a single group of nine interconnect conductors in an M1 expressway routing channel, two groups of nine interconnect conductors in an M2 expressway routing channel, and six groups of nine interconnect conductors in an M3 expressway routing channel.

The expressway routing channels M1, M2, and M3 are segmented so that each -expressway routing channel M1, M2, and M3 spans a distance of a B2×2 tile 22, a B4×4 tile 24 and a B8×8 tile 26, respectively. Between each of the segments in the expressway routing channels M1, M2, and M3 are disposed extensions that can extend the expressway routing channel M1, M2, or M3 an identical distance along the same direction.

The extensions 28 that couple the segments in the expressway routing channels M1 and M2 are passive reprogrammable elements that are preferably a pass device controlled by an SRAM bit. The extensions 28 provide a one-to-one coupling between the interconnect conductors of the expressway routing channels M1 and M2 on either side of the extensions 28. To avoid overcomplicating the drawing figure, only the extensions 28 in a single row and a single column are indicated by the reference numeral 28.

The segments of an M3 expressway routing channel is extended at the boundary of a B16×16 tile 12 where an expressway routing channel M3 crosses a freeway routing channel 16 by a freeway tab (F-tab) 30, and otherwise by an M3 extension 32. To avoid overcomplicating the drawing figure, only the F-tabs 30, and M3 extensions 32 in a single row and a single column are indicated by the reference numeral 30 and 32, respectively.

An F-tab 30 is an active device that includes tri-state buffers and a matrix of reprogrammable switches. The reprogrammable switches are preferably pass devices controlled by an SRAM bit. The interconnect conductors in the freeway routing channels 16 and the expressway routing channel M3 that are fed into an F-tab 30 may be coupled to many of the other interconnect conductors in the freeway routing channels 16 and the expressway routing channel M3 that come into the F-tab 30 by the programmable switches. Further the interconnect conductors in the freeway routing channels 16 and the expressway routing channel M3 that are fed into an F-tab 30 continue in the same direction through the F-tab 30 even though the interconnect conductors are coupled to other interconnect conductors by the reprogrammable switches.

Accordingly, an F-tab 30 implements the dual role of providing an extension of the middle level routing resources in a B16×16 tile 12 to the middle level routing resources in an adjacent B16×16 tile 12 and providing access between the middle level routing resources of B16×16 tile 12 and a freeway routing channel 16 in the highest level of the architecture. An F-tab 30 can combine the two roles of access and extension simultaneously in the formation of a single net.

To avoid overcomplicating the disclosure and thereby obscuring the present invention an F-tab 30 is not described in detail herein. An implementation of an F-tab 30 suitable for use according to the present is disclosed in U.S. patent application Ser. No. 09/519,082, filed Mar. 6, 2000, now abandoned, and hereby incorporated by reference.

An M3 extension 32 is an active device that includes tristatable buffers coupled to a matrix of reprogrammable switches. The reprogrammable switches are preferably pass devices controlled by an SRAM bit. The interconnect conductors in the expressway routing channel M3 that are fed into an M3 extension 32 may be coupled by the reprogrammable switches to many of the other interconnect conductors in the expressway routing channel M3 that come into the M3 extension 32. An M3 extension 32 according to a preferred embodiment of the present invention is described in greater detail below.

To avoid overcomplicating the disclosure and thereby obscuring the present invention an M3 extension 32 is not described in detail herein. An implementation of an M3 extension 32 suitable for use according to the present is disclosed in U.S. patent application Ser. No. 09/519,082, filed Mar. 6, 2000, now abandoned, and hereby incorporated by reference.

As depicted in FIG. 2, all of the expressway routing channels M1, M2, and M3 run both vertically through every column and horizontally through every row of B2×2 tiles 22. At the intersections of each of the expressway routing channels M1, M2, and M3 in the horizontal direction with the expressway routing channels M1, M2 and M3 in the vertical direction is an expressway turn (E-turn) 34 disposed at the center of each B2×2 tile 22. To avoid overcomplicating the drawing figure, only the E-turns 34 disposed in the B2×2 tiles 22 in a single row and a single column are indicated by the reference numeral 34.

An E-turn 34 is a passive device that includes a matrix of reprogrammable switches. The reprogrammable switches are preferably pass devices controlled by an SRAM bit. The interconnect conductors in the expressway routing channels M1, M2 and M3 that are fed into an E-turn 34 may be coupled to many of the other interconnect conductors in the expressway routing channels M1, M2 and M3 that come into the E-turn 30 by the programmable switches. Further, the interconnect conductors in the expressway routing channels M1, M2 and M3 that are fed into an E-turn 34 continue in the same direction through the E-turn 34 even though the interconnect conductors are coupled to other interconnect conductors by the reprogrammable switches.

To avoid overcomplicating the disclosure and thereby obscuring the present invention, an E-turn 34 is not described in detail herein. An implementation of an E-turn 34 suitable for use according to the present is disclosed in U.S. patent application Ser. No. 09/519,312, filed Mar. 6, 2000, now issued as U.S. Pat. No. 6,636,930, and hereby incorporated by reference.

Figure 3:
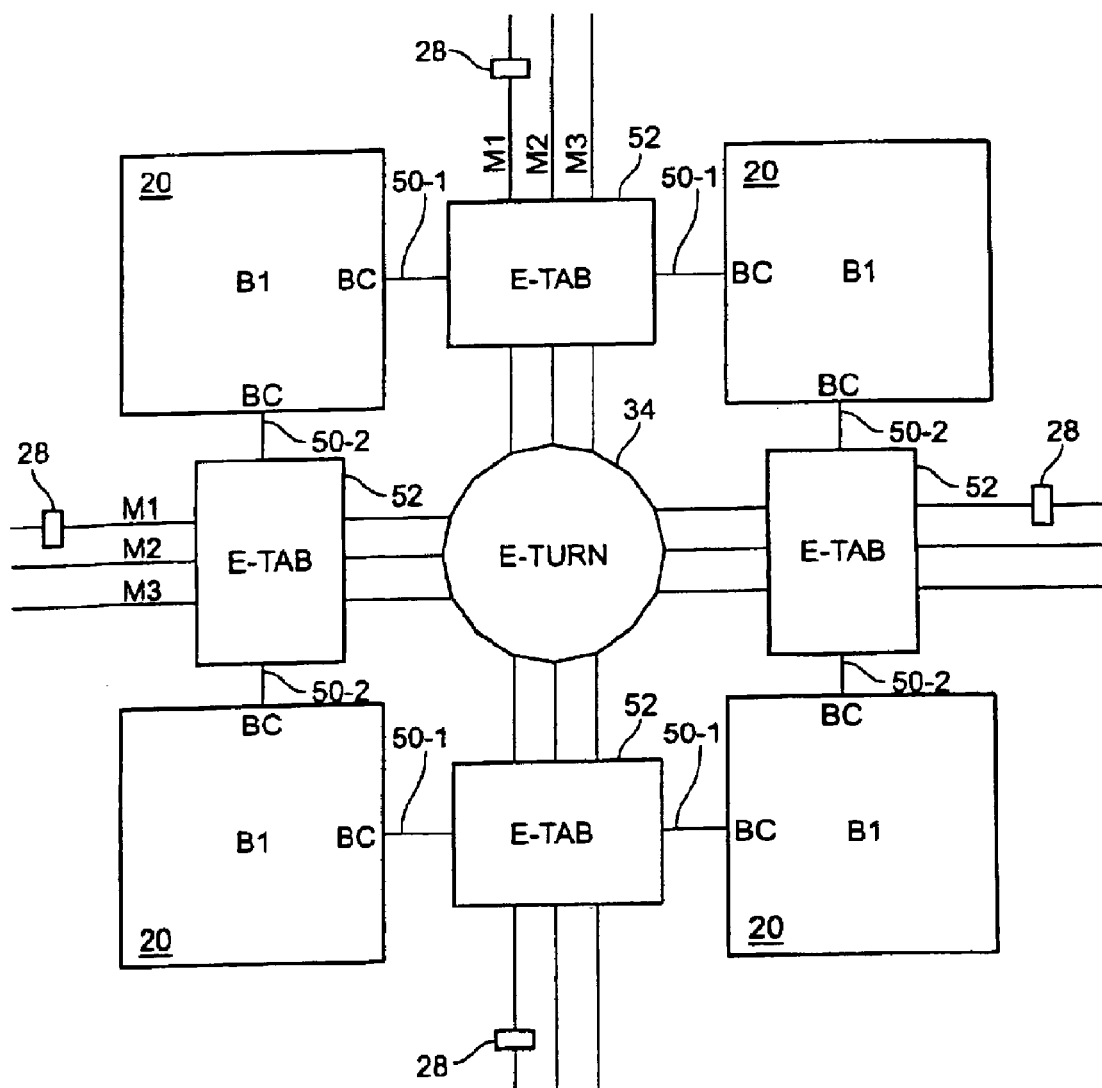
FIG. 3 is a block diagram of a B2×2 tile in an FPGA and the connection of the routing resources in the lowest level to the middle level of a semi-hierarchical architecture according to the present invention.

At the lowest level of the semi-hierarchical FPGA architecture, there are three types of routing resources, block connect (BC) routing channels, local mesh (LM) routing channels, and direct connect (DC) interconnect conductors. According to a preferred embodiment of the present invention, there are nine interconnect conductors in each BC routing channel and six interconnect conductors in each LM routing channel. Of these three, the BC routing channels serve the dual purpose of being able to both couple B1 blocks 20 together at the lowest level in the architecture, and also provide access to the expressway routing channels M1, M2, and M3 in the middle level of the architecture. In FIG. 3 aspects of the BC routing channels will be described, and in FIG. 4 aspects of the LM routing channels and the DC interconnect conductors will be described.

Turning now to FIG. 3, a B2×2 tile 22 including four B1 blocks 20 is illustrated. Associated with each of the B1 blocks 20 is a horizontal BC routing channel 50-1 and a vertical BC routing channel 50-2. Each horizontal BC routing channel 50-1 and vertical BC routing channel 50-2 is coupled to expressway tabs (E-tab) 52 to provide access for each B1 block 20 to the vertical and horizontal expressway routing channels M1, M2, and M3, respectively.

An E-tab 52 is an active device that includes tri-state buffers and a matrix of reprogrammable switches. The reprogrammable switches are preferably a pass device controlled by an SRAM bit. The interconnect conductors in the BC routing channels 50 and the expressway routing channels M1, M2, and M3 that are fed into an E-tab 52 may be coupled by the programmable switches to many of the other interconnect conductors in the expressway routing channels M1, M2, and M3 that come into the E-tab 52. Further, the expressway routing channels M1, M2, and M3 that are fed into an E-tab 52 continue in the same direction through the E-tab 52, even through the interconnect conductors are coupled to other interconnect conductors by the reprogrammable switches.

At the E-tabs 52, the signals provided on the BC routing channels 50 can connect to any of the expressway routing channels M1, M2, or M3. Once a signal emanating from a B1 block 20 has been placed on an expressway routing channel M1, M2 or M3 and traversed a selected distance, an E-tab 52 is employed to direct that signal onto a horizontal or vertical BC routing channel 50-1 or 50-2 into a B1 block 20 at a selected distance from the B1 block 20 from which the signal originated. As the connection between the routing resources at the lowest level in the architecture and the routing resources in the middle level of the architecture, the E-tabs 52 provide that the place and route of signals both inside and outside the B1 blocks 20 may be implemented independently from one another.

To avoid overcomplicating the disclosure and thereby obscuring the present invention, an E-tab 52 is not described in detail herein. An implementation of an E-tab 52 suitable for use according to the present is disclosed in U.S. patent application Ser. No. 09/519,081, filed Mar. 6, 2000, now issued as U.S. Pat. No. 6,567,968, and hereby incorporated by reference.

Figure 4:
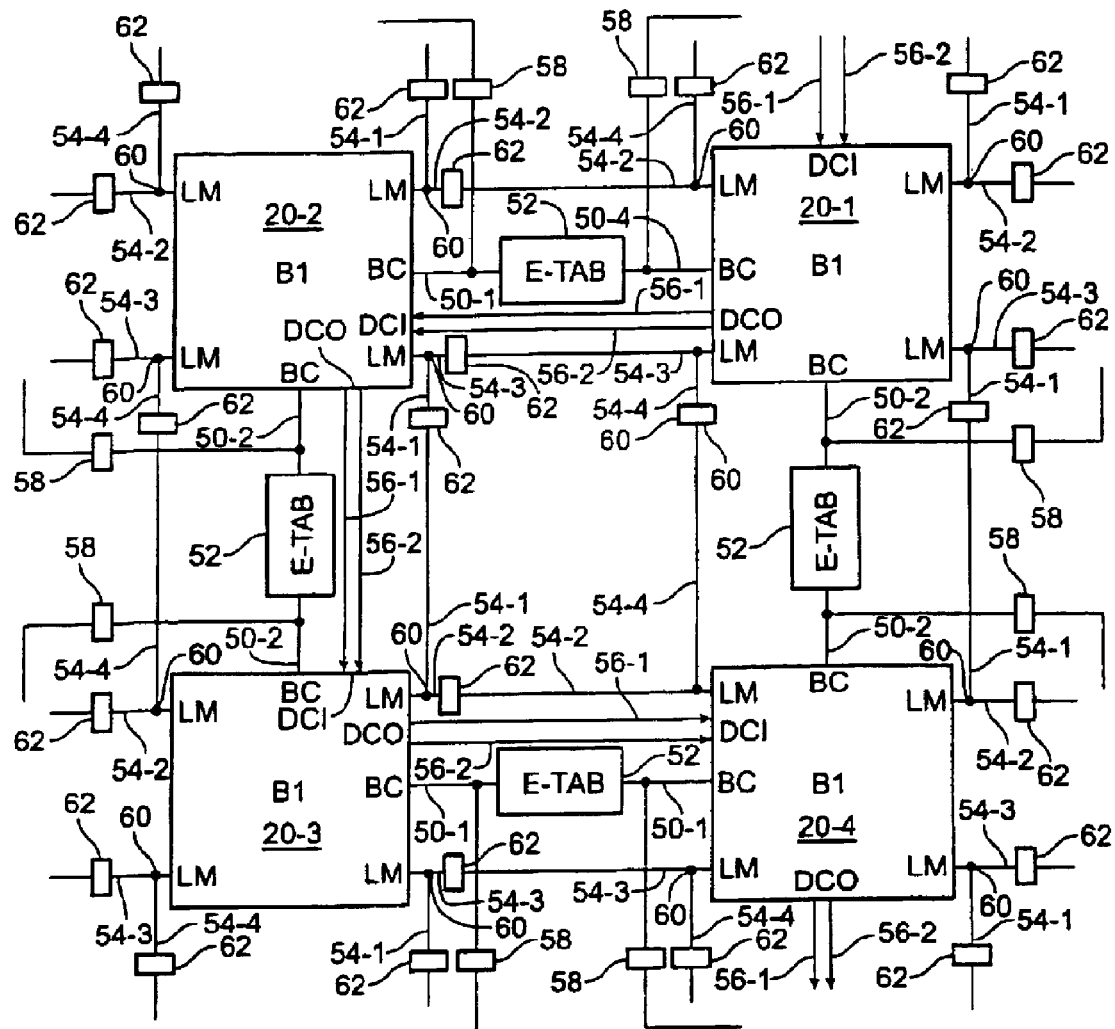
FIG. 4 is a block diagram of a B2×2 tile in an FPGA and the routing resources in the lowest level of a semi-hierarchical architecture according to the present invention.

In FIG. 4, the expressway routing channels M1, M2, and M3 and the E-turn 34 have been omitted for clarity. As further depicted in FIG. 4, in addition to the horizontal and vertical BC routing channels 50-1 and 50-2 associated with each B1 block 20, there are also associated with each B1 block 20 four LM routing channels 54-1 through 54-4 and first and second DC interconnect conductors 56-1 and 56-2. The BC routing channels 50, the LM routing channels 54, and the DC interconnect conductors 56 provide significantly better performance than a strict hierarchy, and further help avoid congesting the expressway routing channels M1, M2, and M3. The BC routing channels 50 and the LM routing channels 54 combine to form two meshes. One is a mesh connection within a B1 block 20, and a second is a mesh connection between B1 blocks 20.

The BC routing channels 50 provide portions of the two meshes. The portion of the mesh connection within a B1 block 20 is described below. In the portion of the mesh providing connection between adjacent B1 blocks 20, each horizontal and vertical BC routing channel 50-1 and 50-2 share an E-tab 52 with a horizontal or vertical BC routing channel 50-1 and 50-2 in an adjacent B1 block 20 that may be employed to couple a signal between adjacent B1 blocks 20 in a first direction. Further, each horizontal and vertical BC routing channel 50-1 and 50-2 share a BC extension 58 with a horizontal or vertical BC routing channel 50-1 and 50-2 in an adjacent B1 block 20 that may be employed to couple a signal between adjacent B1 blocks 20 in a second direction.

The BC extensions 58 provide a one-to-one coupling between the interconnect conductors of the BC routing channels 50 on either side of the BC extensions 58. Accordingly, each BC routing channel 50, in the horizontal and vertical directions is coupled to the adjacent B1 blocks 20 in the corresponding horizontal and vertical directions by a E-tab 52 in a first direction along both the horizontal and vertical and in a second direction along both the horizontal and vertical by a BC extension 58. It should be appreciated that the one-to one coupling between the interconnect conductors of the BC routing channels 50 on either side of the BC extensions 58 may be implemented in a variety of ways known to those of ordinary skill in the art. One example is a passgate controlled by an SRAM bit. Other implementations will be readily appreciated by those of ordinary skill in the art.

From drawing FIG. 4, it should be appreciated that the LM routing channels 54-1 through 54-4 pass through the B1 block 20 as two vertical LM routing channels 51-1 and 54-4 and two horizontal LM routing channels 54-2 and 54-3, and that the intersections 60 of the vertical and horizontal LM routing channels 54 are hardwired along a diagonal.

The LM routing channels 54 also provide portions of the two meshes. The portion of the mesh connection formed along with the BC routing channels 50 within a B1 block 20 will be described below. In the portion of the mesh formed along with BC routing channels between B1 block 20, each of the four LM routing channels 54-1 through 54-4 in each B1 block 20 shares an LM extension 62 with an LM routing channel 54-1 through 54-4 in an adjacent B1 block 20 in either the corresponding horizontal or vertical direction that may be employed to couple a signal between adjacent B1 blocks 20 in either the horizontal or vertical direction.

The LM extensions 62 provide a one-to-one coupling between the interconnect conductors of the LM routing channels 54 on either side of the LM extensions 62. Accordingly, between adjacent B1 blocks 20 there are two LM routing channels 54 from each of the adjacent B1 blocks coupled by a LM extension 62 on all sides of adjacent B1 blocks 20. It should be appreciated that the one-to one coupling between the interconnect—conductors of the LM routing channels 54 on either side of the LM extensions 62 may be implemented in a variety of ways known to those of ordinary skill in the art. One example is a passgate controlled by an SRAM bit. Other implementations will be readily appreciated by those of ordinary skill in the art.

The DC interconnect conductors 56-1 and 56-2 form a high performance direct connection between the logic elements in adjacent B1 blocks 20 to implement data path functions such as counters, comparators, adders and multipliers. As will be described below, each B1 block 20 includes four clusters of logic elements. Preferably, each of the four clusters includes two three input look-up tables (LUT3), a single two-input look-up table (LUT2), and a D-type flip-flop (DFF). In the DC interconnect conductor routing path, each of the DC interconnect conductors 56-1 and 56-2 is multiplexed to an input to a separate one of the two LUT3s in each of the four clusters of a B1 block 20. The DC interconnect conductors 56-1 and 56-2 are connected between vertically adjacent B1 blocks 20 as is illustrated in FIG. 4.

Figure 5:
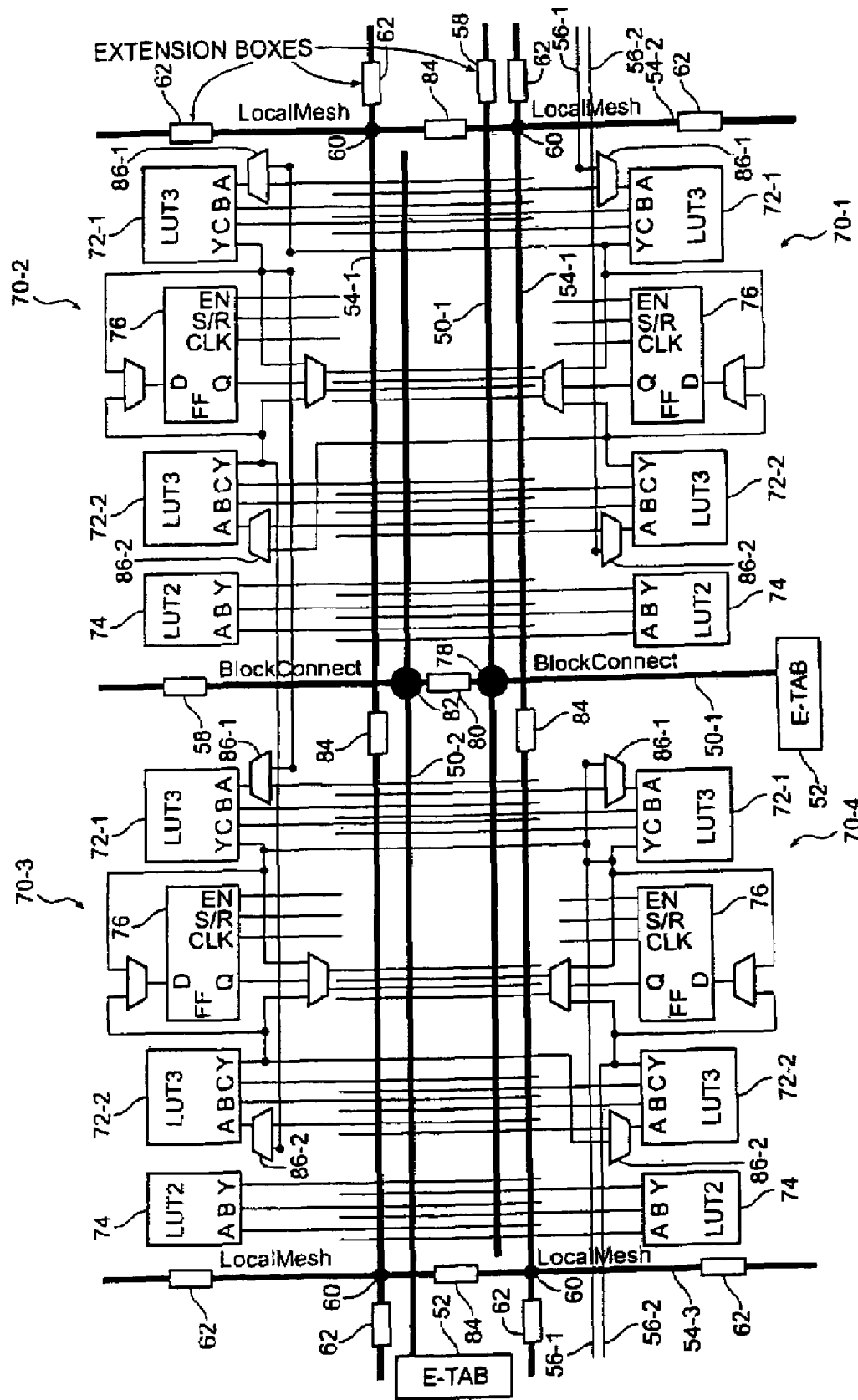
FIG. 5 is a block diagram of a B1 block in an FPGA and the routing resources in the lowest level of a semi-hierarchical architecture according to the present invention.

FIG. 5 illustrates a B1 block 20 according to the present invention in greater detail. As described above, each B1 block 20 includes four clusters 70-1 through 70-4 of devices. Each of the four clusters 70-1 through 70-4 includes first and second LUT3s 72-1 and 72-2, respectively, a LUT2 74, and a DFF 76. Each of the LUT3s 72 have first, second, and third inputs indicated as "A", "B", and "C", and a single output indicated as "Y". Each of the LUT2s 74 have first and second inputs indicated as "A" and "B", and a single output indicated as "Y". With a LUT3 72, any three input Boolean logic function may be implemented, and with a LUT2 74 any two input Boolean logic function may be implemented.

Each DFF 76 has a data input indicated as "D" and a data output indicated as "Q". In each of the clusters 70-1 through 70-4, the outputs "Y" of the LUT3s 72-1 and 72-2 are multiplexed to the input of DFF 76, and further multiplexed with the output of the DFF 76 to form first and second outputs of each of the clusters 70-1 through 70-4.

Each DFF 76 also has an enable (EN) input, a set/reset (S/R) input, and a clock (CLK) input. The EN, S/R, and CLK input are coupled to utility routing channels, a discussion of which is beyond the scope of this disclosure, but which is found in U.S. patent application Ser. No. 09/255,060, filed Feb. 22, 1999, now abandoned, and hereby incorporated by reference.

Within the B1 block 20, the horizontal BC routing channel 50-1 is disposed between the upper clusters 70-1 and 70-2 and the lower clusters 70-3 and 70-4, and the vertical BC routing channel 50-2 is disposed between the two clusters 70-1 and 70-3 on the left side of the B1 block 20 and the two clusters 70-2 and 70-4 on the right side of the B1 block 20. It should be appreciated that due to the layout of the B1 block depicted in FIG. 4 wherein the input and outputs of the devices in the clusters 70-1 through 70-4 are all depicted horizontally, the horizontal BC routing channel 50-1 forms a diagonally hardwired connection at 78 with a routing channel that effectively sends the horizontal BC routing channel 50-1 in a vertical direction. A diagonally hardwired connection 82 pairwise shorts the horizontal and vertical BC routing channels 50-1 and 50-2 to provide dual accessibility to the logic resources in the B1 block 20 from more than one side.

Disposed between the diagonally hardwired connection 78 and the diagonally hardwired connection 82 is a BC splitting extension 80 which provides a one-to-one coupling between the interconnect conductors of the horizontal BC routing channel 50-1 on either side of the BC splitting extension 80. It should be appreciated that the one-to one coupling between the interconnect conductors of the horizontal BC routing channel 50-1 on either side of the BC splitting extension 80 may be implemented in a variety of ways known to those of ordinary skill in the art. One example is a passgate controlled by an SRAM bit. Other implementations will be readily appreciated by those of ordinary skill in the art.

According to the present invention providing the BC splitting extension 80 enhances the routability of the horizontal and vertical BC routing channels 50-1 and 50-2 to the inputs and outputs of the devices in the clusters 70-1 through 70-4. Although the hardwired diagonal connection 82 is disposed at the intersections of the interconnect conductors in the horizontal BC channel 50-1 and the interconnect conductors in the vertical BC channel 50-2 so that all of the interconnect conductors in the horizontal and vertical BC channels 50-1 and 50-2 are accessible to each of the four clusters 70-1 through 70-4, the BC splitting extension 80 essentially splits, the BC channel 50-1 from the BC channel 50-2. With the BC splitting extension 80, the flexibility for connecting the logic resources to the M1, M2, and M3 routing channels is improved from the flexibility provided simply by the hardwired diagonal connection 82.

The LM routing channels 54-1 and 54-4 pass vertically through the B1 block 20 and the LM routing channels 54-2 and 54-3 pass horizontally through the B1 block 20. Each of the LM routing channels 54 is segmented in the B1 block 20 by extensions 84. The extensions 84 provides a one-to-one coupling between the interconnect conductors of the LM routing channels 54 on either side of the extensions 84. It should be appreciated that the one-to one coupling between the interconnect conductors of the LM routing channel 54 on either side of the extensions 84 may be implemented in a variety of ways known to those of ordinary skill in the art. One example is a passgate controlled by an SRAM bit. Other implementations will be readily appreciated by those of ordinary skill in the art.

Further, as described above, the intersections 60 of the vertical LM routing channels 54-1 and 54-4 and horizontal LM routing channels 54-2 and 54-3 are hardwired along a diagonal.

The horizontal and vertical BC routing channels 50-1 and 50-2, and the two vertical LM routing channels 54-1 and 54-4 form intersections with the inputs and outputs of the LUT2s 74, the inputs of the LUT3s 72-1 and 72-2, and the multiplexed outputs of the LUT3s 72-1 and 72-2 and the DFF 76 in each of the clusters 70-1 through 70-4.

At some of the intersections formed between the horizontal and vertical BC routing channels 50-1 and 50-2, and the two vertical LM routing channels 54-1 and 54-4 and the inputs of the LUT2s 74 and the inputs of the LUT3s 72-1 and 72-2 are disposed reprogrammable elements. For each separate LUT2s 74 and the LUT3s 72-1 and 72-2 input, the reprogrammable elements disposed at selected intersections are preferably passgates controlled by SRAM bits that multiplex the horizontal and vertical BC routing channels 50-1 and 50-2, and the two vertical LM routing channels 54-1 and 54-4 with the separate input.

Accordingly, at a given time, each separate LUT2s 74 and the LUT3s 72-1 and 72-2 input may be coupled by a reprogrammable element to only one of the interconnect conductors in the horizontal and vertical BC routing channels 50-1 and 50-2, and the two vertical LM routing channels 54-1 and 54-4.

At some of the intersections formed between the horizontal and vertical BC routing channels 50-1 and 50-2, and the two vertical LM routing channels 54-1 and 54-4 and the outputs of the LUT2s 74 and the multiplexed outputs of the LUT3s 72-1 and 72-2 and the DFF 76 are disposed reprogrammable elements, such as a pass gate controlled by an SRAM bit. These selected intersections, unlike the intersections formed between the horizontal and vertical BC routing channels 50-1 and 50-2, and the two vertical LM routing channels 54-1 and 54-4 and the inputs of the LUT2s 74 and the inputs of the LUT3s 72-1 and 72-2, are not multiplexed. Accordingly, at a given time, each separate LUT2 74 output and LUT3 72-1 and 72-2 and DFF 76 multiplexed output may be coupled to any of the interconnect conductors in the horizontal and vertical BC routing channels 50-1 and 50-2, and the two vertical LM routing channels 54-1 and 54-4 having a reprogrammable element disposed at an intersection. It should be appreciated, that no more than one LUT2 74 output and LUT3 72-1 and 72-2 and DFF 76 multiplexed output may be coupled simultaneously to the same interconnect conductor in the horizontal and vertical BC routing channels 50-1 and 50-2, and the two vertical LM routing channels 54-1 and 54-4.

As described above, each of the DC interconnect conductors 56-1 and 56-2 is multiplexed by multiplexers 86-1 and 86-2, respectively, in a serial fashion to an input of a separate one of the two LUT3s in each cluster 70-1 through 70-4 of a BI block 20. For example, in the serial connection, the DC interconnect conductor 56-1 is multiplexed to the "A" input of the LUT3 72-1 of the cluster 70-1. Next, the "Y" output of the LUT3 72-1 in cluster 70-1 is multiplexed to the "A" input of the LUT3 72-1 in cluster 70-2. Next, the "Y" output of the LUT3 72-1 in cluster 70-2 is multiplexed to the "A" input of the LUT3 72-1 in cluster 70-3. Next, the "Y" output of the LUT3 72-1 in cluster 70-3 is multiplexed to the "A" input of the LUT3 72-1 in cluster 70-4. Finally, the "Y" output of the LUT3 72-1 in cluster 70-4 pass out of the B1 block 20, and is multiplexed to the "A" input of the LUT3 72-1 in cluster 70-2 of the B1-block 20 disposed vertically below. The DC interconnect conductors 56-2 is similarly connected, except that it is input and output from the LUT3 72-2 in each of the clusters 70-1 through 70-4.

Figure 6:
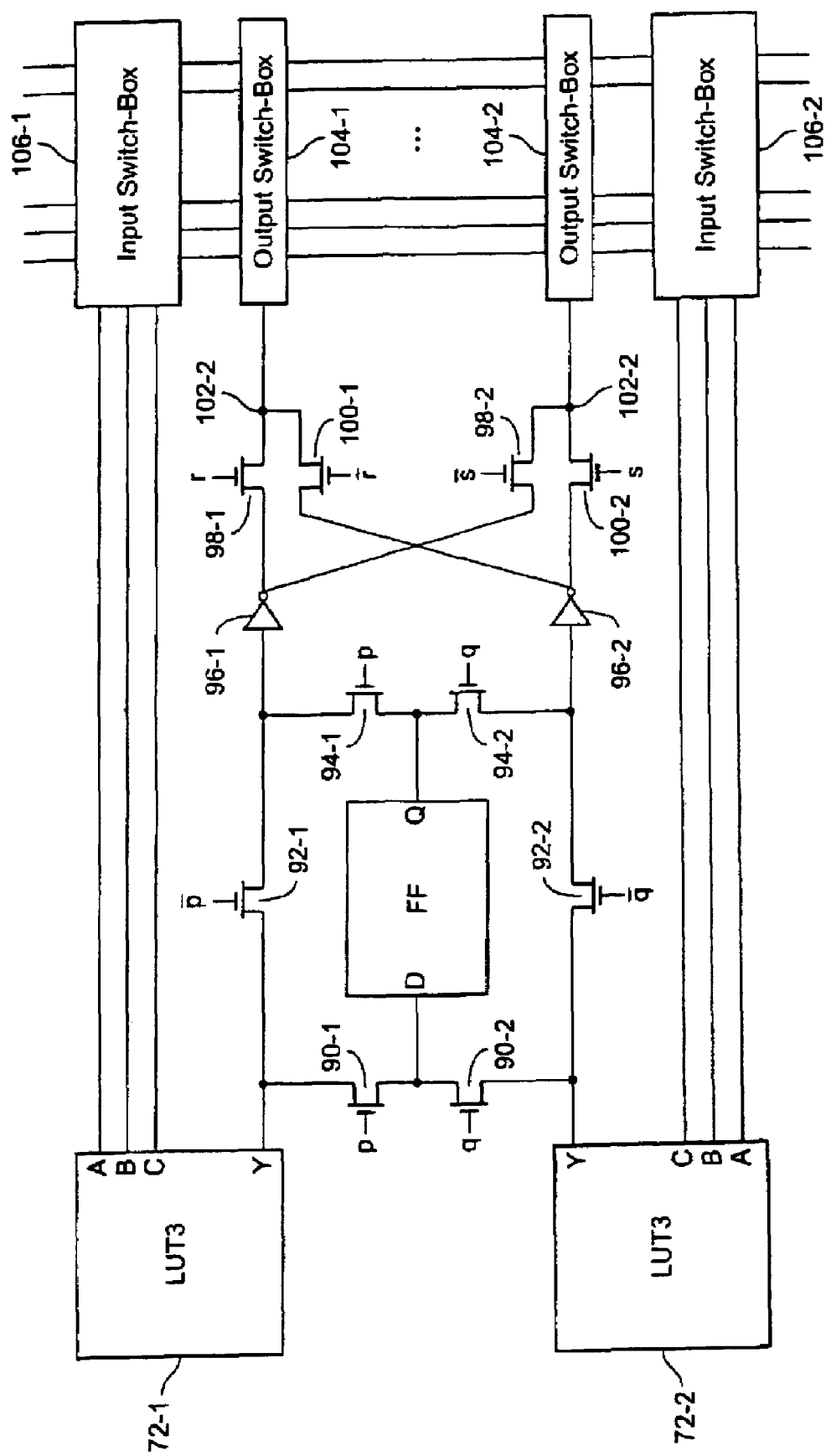
In FIG. 6 illustrates the symmetrization of the outputs of a cluster depicted in FIG. 5 according to the present invention.

Turning now to FIG. 6, according to the present invention, the coupling of the outputs of the LUT3s 72-1 and 72-2 to the D-type flip-flop 76 in a cluster 70 shown generally as multiplexers in FIG. 5 is illustrated in greater detail. In FIG. 6, the output Y of LUT3 72-1 is coupled to the source of n-channel MOS pass transistors 90-1 and 92-1, and the output Y of LUT3 72-2 is coupled to the source of n-channel MOS pass transistors 90-2 and 92-2. The drains of n-channel MOS transistors 90-1 and 90-2 are connected together to form a common node that is coupled to the D input of D-type flip-flop 76. The drain of n-channel MOS transistor 92-1 is coupled to the source of n-channel MOS transistor 94-1 and to the input of an inverter 96-1, and the drain of n-channel MOS transistor 92-2 is coupled to the source of n-channel MOS transistor 94-2 and to the input of inverter 96-2. The drain of n-channel MOS transistors 94-1 and 94-2 are connected together to form a node that is coupled to the output Q of D-type flip-flop 76.

The output of inverter 96-1 is coupled to the source of n-channel MOS pass transistors 98-1 and 98-2, and the output of inverter 96-2 is coupled to the source of n-channel MOS pass transistors 100-1 and 100-2. The drains of n-channel MOS pass transistors 38-1 and 100-1 are connected together to form a common node 102-1 that is coupled to an output switch box 104-1, and the drains of n-channel MOS pass transistors 98-2 and 100-2 are connected together to form a common node 102-2 that is coupled to a switch box 104-2. As described above with regard to FIG. 5, inputs of the LUT3s 72 and the multiplexed outputs of the LUT3s 72 and the D type flip-flop 76 form intersections with BC channels 50 and LM conductors 54 at some of which are disposed reprogrammable elements. These intersections are shown generally as input and output switch boxes, 106 and 104, respectively. To avoid overcomplicating the disclosure and thereby obscuring the present invention the input and output switch boxes 106 and 104 are not described in detail herein.

To avoid overcomplicating the disclosure and thereby obscuring the present invention input and output switch boxes 106 and 104 are not described in detail herein. An implementation of input and output switch boxes 106 and 104 suitable for use according to the present is disclosed in U.S. patent application Ser. No. 09/519,081, filed Mar. 6, 2000, now issued as U.S. Pat. No. 6,567,968, and hereby incorporated by reference.

The n-channel MOS pass transistors 90-1, 92-1, and 94-1 are controlled by the state of an SRAM bit (p) coupled to their gates. N-channel MOS pass transistors 90-1 and 94-1 are turned on by a first state of the SRAM bit (p), and n-channel MOS pass transistor 92-1 is fumed on by the complement of the first state of SRAM bit (p). The n-channel MOS pass transistors 90-2, 92-2, and 94-2 are controlled by the state of an SRAM bit (q) coupled to their gates. N-channel MOS pass transistors 90-2 and 94-2 are turned on by a first state of the SRAM bit (q) and n-channel MOS pass transistor 92-2 is turned on by the complement of the first state of the SRAM bit (q).

The n-channel MOS pass transistors 98-1 and 100-1 are controlled by the state of an SRAM bit (r), and the n-channel MOS pass transistors 98-2 and 100-2 are controlled by the state of an SRAM bit (s). The n-channel MOS pass transistor 98-1 is turned on when a first state of the SRAM bit (r) is applied to the gate of n-channel MOS pass transistor 98-1, and the n-channel MOS pass transistor 100-1 is turned on when a complement of the first state of the SRAM bit (r) is applied to the gate of n-channel MOS transistor 100-1, The n-channel MOS pass transistor 98-2 is turned on when a first state of the SRAM bit (s) is applied to the gate of n-channel MOS pass transistor 98-2, and the n-channel MOS pass transistor 100-2 is turned on when a complement of the first state of the SRAM bit (s) is applied to the gate of the n-channel MOS pass transistor 100-2.

According to the present invention, the symmetrization of the outputs of the LUT3s 72-1 and 72-2 and the output of the D-type flip-flop 76 as depicted in FIG. 6 provides interconnect symmetry for nets that are entirely with a single B1 block 20, for those nets outside a selected B1 block 20 that are driven from within the selected B1 block 20, and for driving nets within a selector B1 block 20 and outside the selected B1 block 20.

Though it is contemplated that all of the Y outputs of the LUT3s 72 in a B1 block 20 could be completely symmetrized for greater flexibility, it is preferred due to the design choice to constraint circuit area that only the LUT3s 72-1 and 72-2 in the same cluster 70 be symmetrized. In the operation of the symmetrization circuitry the outputs of either of the LUT3s 72-1 and 72-2, and the output of the D-type flip-flop 76 can drive either of the switch boxes 104-1 or 104-2 or both if desired.

As an example, when n-channel MOS pass transistor 92-1 is turned on, the n-channel MOS pass transistors 90-1 and 94-1 are fumed off and the output signal Y from LUT3 72-1 can be passed by the n-channel MOS pass transistors 98-1 and 98-2 to either or both of the output switch boxes 104-1 and 104-2. Similarly, when n-channel MOS pass transistor 92-2 is turned on, the n-channel MOS pass transistors 90-2 and 94-2 will be turned off and the output signal Y from LUT3 72-2 can be passed by the n-channel MOS pass transistors 100-1 and 100-2 to either or both of the output switch boxes.

When n-channel MOS transistor 92-1 is turned off, the n-channel MOS pass transistors 90-4 and 94-1 will be turned on, and the output of the D-type flip-flop 76 can be passed to either or both of the output switch boxes 104-1 and 104-2 by n-channel MOS transistors 98-1 and 98-2. Since it is a condition that both 90-1 and 90-2 cannot be turned on at the same time, the n-channel MOS transistor 92-2 will be turned on and the output of Y of LUT3 72-2 could also be passed as described above.

When n-channel MOS pass transistors 92-2 is turned off, n-channel MOS pass transistors 90-2 and 94-2 will be turned on, and the output of the D-type flip-flop 76 can be passed to either or both of the output switch boxes 104-1 and 104-2 by the n-channel MOS pass transistor 100-1 and 100-2. Further, the n-channel MOS pass transistor 92-1 will be turned on and the output Y of LUT3 72-1 may also be passed as described above.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A hierarchical interconnect architecture for a field programmable gate array integrated circuit including a plurality of logic function blocks, the architecture including:
   a third level including:
      a plurality of third groups of functional logic blocks at the third level, wherein:
         each third group spans a third length and a third width, and
      a set of third routing resources that includes:
         a plurality of freeway routing channels associated with each third group of functional logic blocks, each freeway routing channel associated with one of the third groups including a plurality of interconnect conductors configured to make programmable connections to functional logic blocks in other ones of the third groups; and
   a second level including:
      a plurality of second groups of functional logic blocks at the second level, wherein:
         each second group spanning a second length and a second width, and
      the number of functional logic blocks in the third groups is greater than the number of functional logic blocks in the second groups, a set of second routing resources that includes:
a plurality of expressway routing channels including a plurality of interconnect conductors configured to make programmable connections between different ones of the functional logic blocks in the second group and to interconnect conductors in the set of third routing resources; and
a first level including:
a plurality of first groups of functional logic blocks at the first level, wherein:
each first group spans a first length and a first width,
the number of functional logic blocks in the second groups is greater than the number of functional logic blocks in the first groups,
each of the plurality of groups of functional blocks comprises a plurality of clusters, each cluster comprising at least one LUT and at least one DFF; and
a set of first routing resources;
a block connect routing channel including a plurality of interconnect conductors configured to make programmable connections between different ones of the functional logic blocks in the second group and to interconnect conductors in the set of second routing resources;
a local mesh routing channel including a plurality of interconnect conductors configured to make programmable connections between adjacent ones of the functional logic blocks in a single one of the first groups of the functional logic blocks;
a direct connect routing channel including a plurality of interconnect conductors configured to make programmable connections between selected elements of adjacent ones of the functional logic blocks in a single one of the first groups of the functional logic blocks.

2. The hierarchical interconnect architecture of claim 1 wherein:
programmable connections are made using reprogrammable elements.

3. The hierarchical interconnect architecture of claim 2 wherein:
the reprogrammable elements are SRAM switches.

4. The hierarchical interconnect architecture of claim 2 wherein:
the programmable connections between ones of the third group of functional logic blocks are made in a plurality of first programmable matrices of reprogrammable switches.

5. The hierarchical interconnect architecture of claim 1 wherein:
the interconnect conductors in the plurality of freeway routing channels have a length substantially equal to one of the third length and the third width.

6. The hierarchical interconnect architecture of claim 1 wherein:
programmable connections between different ones of the functional logic blocks in the second group and to interconnect conductors in the set of third routing resources are made in a plurality of second programmable matrices of reprogrammable switches.

7. The hierarchical interconnect architecture of claim 1 wherein:
programmable connections between different ones of the functional logic blocks in the second group and to interconnect conductors in the set of second routing resources are made in a plurality of third programmable matrices of reprogrammable switches.

8. The hierarchical interconnect architecture of claim 1 wherein:
each cluster comprises:
a plurality of three input LUTs, each having three inputs and an output;
a two input LUT; and
a DFF having an input and an output.

9. The hierarchical interconnect architecture of claim 8 wherein:
in each cluster:
the output of a first three input LUT is programmably coupled via a first programmable switch to the input of the DFF, and
the output of a second three input LUT is programmably coupled via a second programmable switch to the input of the DFF.

10. The hierarchical interconnect architecture of claim 9 wherein:
each cluster further comprises:
a first inverter having an output and an input programmably coupled to the output of the first three input LUT via a third programmable switch; and
a second inverter having an output and an input programmably coupled to the output of the second three input LUT via a fourth programmable switch.

11. The hierarchical interconnect architecture of claim 10 wherein:
in each cluster:
the output of the DFF is programmably coupled via a fifth programmable switch to the input of the first inverter; and
the output of the DFF is programmably coupled via a sixth programmable switch to the input of the second inverter.

12. The hierarchical interconnect architecture of claim 10 wherein:
each cluster is associated with:
a first output switch box having an input programmably coupled to the output of the first inverter via a seventh programmable switch and coupled to the output of the second inverter via a eighth programmable switch; and
a second output switch box having an input programmably coupled to the output of the first inverter via a ninth programmable switch and coupled to the output of the second inverter via a tenth programmable switch.

* * * * *